(12) United States Patent
Nidhi et al.

(10) Patent No.: US 9,437,591 B1
(45) Date of Patent: Sep. 6, 2016

(54) CROSS-DOMAIN ELECTROSTATIC DISCHARGE PROTECTION DEVICE

(71) Applicant: Vanguard International Semiconductor Corporation, Hsinchu (TW)

(72) Inventors: Karuna Nidhi, Patna (IN); Federico Agustin Altolaguirre, Zhubei (TW); Ming-Dou Ker, Jhubei (TW); Geeng-Lih Lin, Jhudong Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/849,054

(22) Filed: Sep. 9, 2015

(51) Int. Cl.
| H01L 29/66 | (2006.01) |
| H01L 27/02 | (2006.01) |
| H01L 29/10 | (2006.01) |
| H01L 27/092 | (2006.01) |
| H01L 49/02 | (2006.01) |
| H01L 27/06 | (2006.01) |

(52) U.S. Cl.
CPC ....... *H01L 27/0262* (2013.01); *H01L 27/0266* (2013.01); *H01L 27/0288* (2013.01); *H01L 27/0635* (2013.01); *H01L 27/092* (2013.01); *H01L 28/20* (2013.01); *H01L 28/40* (2013.01); *H01L 29/1095* (2013.01)

(58) Field of Classification Search
None
See application file for complete search history.

(56) References Cited

U.S. PATENT DOCUMENTS

| 6,011,681 | A * | 1/2000 | Ker ............... H01L 27/0251 361/111 |
| 6,594,132 | B1 * | 7/2003 | Avery ............ H01L 27/0262 361/111 |
| 2002/0187601 | A1 * | 12/2002 | Lee ................ H01L 27/0727 438/200 |

* cited by examiner

*Primary Examiner* — Benjamin Sandvik
*Assistant Examiner* — Herve Assouman
(74) *Attorney, Agent, or Firm* — Birch, Stewart, Kolasch & Birch, LLP (57) ABSTRACT

A cross-domain electrostatic protection device having four embedded silicon controlled rectifiers (a QSCR structure) embedded in a single cell. Two grounded-gate NMOS transistors are embedded into the cross-domain electrostatic protection device for reducing trigger voltage of the QSCR structure. Furthermore, an external trigger circuit and a bias circuit are applied to the cross-domain electrostatic protection device to reduce trigger voltage of the QSCR structure and leakage current.

16 Claims, 10 Drawing Sheets

CROSS-DOMAIN ELECTROSTATIC DISCHARGE PROTECTION DEVICE

BACKGROUND OF THE INVENTION

1. Field of the Invention

The present invention relates to an electrostatic discharge protection device, and in particular to a cross-domain electrostatic discharge protection device for integrated circuits.

2. Description of the Related Art

Generally, integrated circuits will include multiple power domains. A device may, for instance, include an input/output (I/O) circuit along with a core circuit, each of which may be associated with a different power domain (e.g., the I/O circuit may be associated with a high-voltage power domain, the core circuit may be associated with a low-voltage power domain, etc.). Thus, signals may travel from a high-voltage power domain to a low-voltage power domain. Typically, from an electrostatic discharge (ESD) protection design point of view, one of the most critical issues of cross-domain interface circuits is gate oxide breakdown of low-voltage metal-oxide-semiconductor field-effect transistors (MOSFETs). For cross-power-domain ESD protection, ESD protection devices are required to be set between any pin-to-pin combination of voltage supplies or power nodes.

Figure 1:
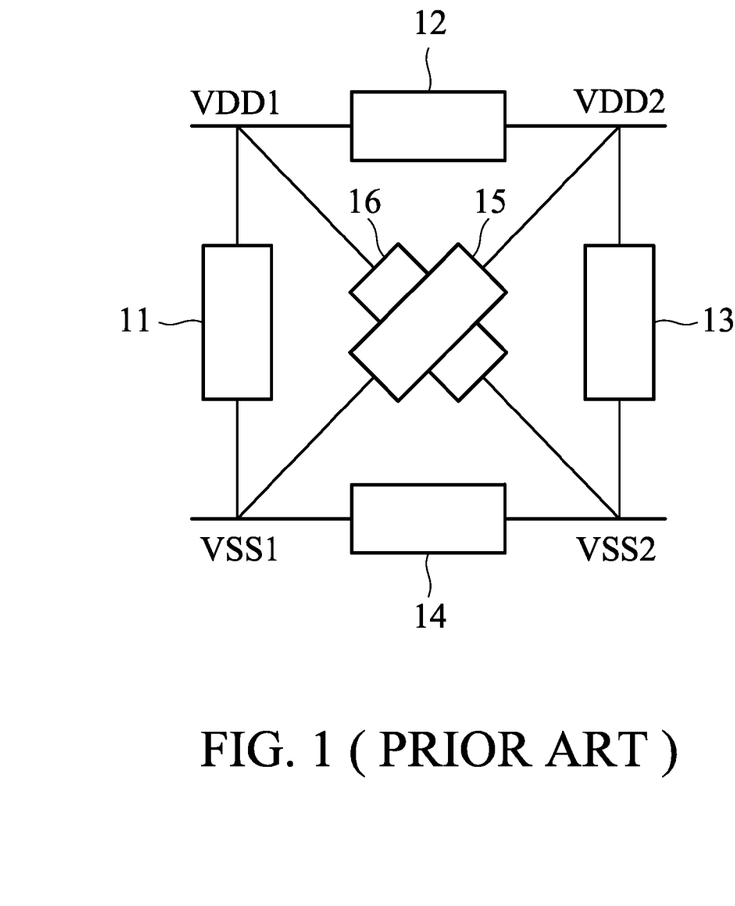
FIG. 1 shows an ESD protection scheme for cross-power-domain ESD protection.
Figure 2:
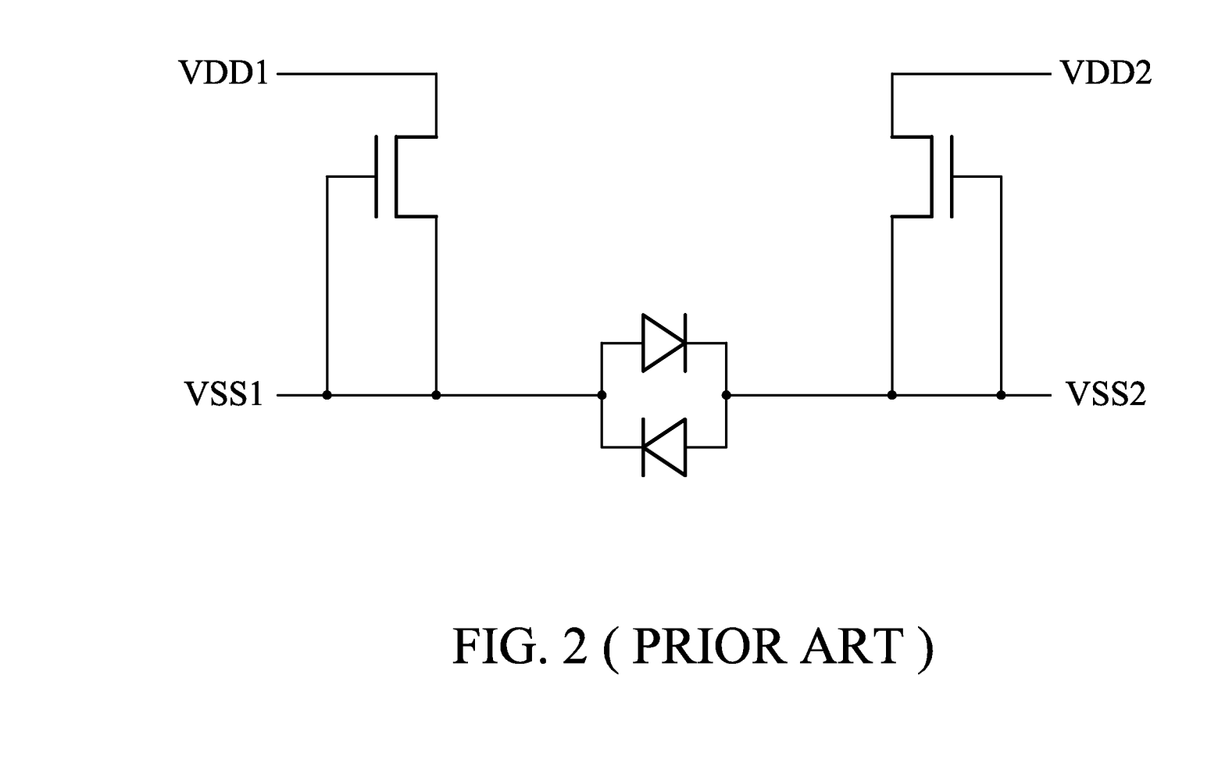
FIG. 2 shows an example of simple ESD protection for cross-power-domain.

FIG. 1 shows an ESD protection scheme for cross-power-domain ESD protection. FIG. 2 shows an example of simple ESD protection for cross-power-domain. For example, two power domains VDD1-VSS1 and VDD2-VSS2 are applied in an integrated circuit (for brevity, the main portion and peripheral of the integrated circuit are not shown in FIGS. 1 and 2). In FIG. 1, using six ESD cells 11~16 can provide full ESD protection for any path of VDD1-VSS1, VDD1-VSS2, VDD1-VDD2, VDD2-VSS1, VDD2-VSS2 and VSS1-VSS2, but it consumes too large an area. As a trade-off for area and cost requirements, some of the ESD cells may be removed. Thus, in FIG. 2, a simple ESD protection scheme is provided. The simple scheme consumes a smaller area, but its ESD protection is degraded since some direct paths (such as VDD1-to-VSS2 and VDD2-to-VSS1) are not protected.

Accordingly, it is desirable to propose a cross-domain ESD protection cell (device) with a novel structure capable of providing sufficient ESD discharge paths and consuming less of an area.

BRIEF SUMMARY OF THE INVENTION

According to an aspect of the invention, a cross-domain electrostatic discharge (ESD) protection device comprises: a deep n-well formed in a substrate; a first p-well and a second p-well formed in the deep n-well; a first n-well formed in the deep n-well and between the first p-well and the second p-well, the first n-well contacting the first p-well and the second p-well; a first p-type doped region and a second p-type doped region formed in the first n-well; a third P-type doped region and a fourth P-type doped region respectively formed in the first p-well and the second p-well; a first n-type doped region formed in the first p-well and between the third and first p-type doped regions; and a second n-type doped region formed in the second p-well and between the second and fourth P-type wells. The first p-type doped region is connected to a first voltage supply of a first power domain, the third p-type doped region and the first n-type doped region are connected to a second voltage supply of the first power domain. The second p-type doped region is connected to a third voltage supply of a second power domain, and the fourth p-type doped region and the second n-type doped region are connected to a fourth voltage supply of the second power domain, wherein the first and second power domains are different domains.

According to another aspect of the invention, the cross-domain electrostatic discharge protection device further comprises: a third n-type doped region formed in a first boundary region of the first p-well and the first n-well, and between the first n-type doped region and the first p-type doped region; a first gate structure formed on the first p-well and between the first n-type doped region and the third n-type doped region; a fourth n-type doped region formed in a second boundary region of the second p-well and the first n-well, and between the second n-type doped region and the second p-type doped region; and a second gate structure formed on the second p-well and between the second n-type doped region and the fourth n-type doped region. The first and second gate structures are respectively connected to the second voltage supply and the fourth voltage supply.

According to another aspect of the invention, the cross-domain electrostatic discharge protection device further comprises: a p-type bias region formed in the first n-well and between the first p-type doped region and the second p-type doped region; a fifth p-type doped region and a seventh p-type doped region respectively formed in the first p-well and the first n-well, and disposed between the first n-type doped region and the first p-type doped region; a sixth p-type doped region and an eighth p-type doped region respectively formed in the second p-well and the first n-well, and disposed between the second n-type doped region and the second p-type doped region; a third gate structure formed on the first n-well and between the first and seventh p-type doped regions; a fourth gate structure formed on the first n-well and between the second and eighth p-type doped regions. The fifth and seventh p-type doped regions are electrically connected and the sixth and eighth p-type doped regions are electrically connected, the third and fourth gate structures are connected to a detection node and the p-type bias region is connected to a bias voltage.

According to another aspect of the invention, the cross-domain electrostatic discharge protection device further comprises: an ESD detection and trigger circuit, connected to the first, second, third and fourth p-type doped region, the p-type bias region, and the third and fourth gate structures. It should be noted that the ESD detection and trigger circuit may comprise: a first diode having an anode and a cathode respectively connected to the third p-type doped region and the fourth p-type doped region; a second diode having a cathode and an anode respectively connected to the third p-type doped region and the fourth p-type doped region; a third diode and a fourth diode having anodes connected together and cathodes respectively connected to the third p-type doped region and the fourth p-type doped region; a capacitor connected between the anodes of the third and fourth diodes and the detection node; and a resistor connected between the detection node and the p-type bias region.

Furthermore, the cross-domain electrostatic discharge protection device may further comprise: a first PMOS transistor and a second PMOS transistor, connected in series, and the serially connected first and second PMOS transistors are further connected between the first voltage supply and the third voltage supply. The first and second PMOS transistors respectively connected to the third voltage supply and the first voltage supply, and bulks and a connection node of the first and second PMOS transistors are connected to the p-type bias region.

According to another aspect of the invention, a cross-domain electrostatic discharge protection device, comprises: a deep n-well formed in a substrate; a first p-well and a second p-well formed in the deep n-well; a first n-well formed in the deep n-well and between the first p-well and the second p-well, the first n-well contacting the first p-well and the second p-well; a first p-type doped region and a second p-type doped region formed in the first n-well; a third P-type doped region and a fourth P-type doped region respectively formed in the first p-well and the second p-well; a first n-type doped region formed in the first p-well and between the third and first p-type doped regions; and a second n-type doped region formed in the second p-well and between the second and fourth P-type wells (p2, p4); a p-type bias region formed in the first n-well and between the first p-type doped region and the second p-type doped region; a fifth p-type doped region and a seventh p-type doped region respectively formed in the first p-well and the first n-well, and disposed between the first n-type doped region and the first p-type doped region; a sixth p-type doped region and an eighth p-type doped region respectively formed in the second p-well and the first n-well, and disposed between the second n-type doped region and the second p-type doped region; a third gate structure formed on the first n-well and between the first and seventh p-type doped regions; a fourth gate structure formed on the first n-well and between the second and eighth p-type doped regions; and an ESD detection and trigger circuit, connected to the first, second, third and fourth p-type doped region, the p-type bias region, and the third and fourth gate structures. The first p-type doped region is connected to a first voltage supply of a first power domain, the third p-type doped region and the first n-type doped region are connected to a second voltage supply of the first power domain. The second p-type doped region is connected to a third voltage supply of a second power domain, the fourth p-type doped region and the second n-type doped region are connected to a fourth voltage supply of the second power domain; and wherein the first and second power domains are different domains. The fifth and seventh p-type doped regions are electrically connected and the sixth and eighth p-type doped regions are electrically connected, the third and fourth gate structures are connected to a detection node and the p-type bias region is connected to a bias voltage. The ESD detection and trigger circuit generates a detection voltage to the third and fourth gate structures to activate the cross-domain ESD protection device when an ESD event occurs at any of the first, second, third and fourth voltage supply.

Furthermore, the ESD detection and trigger circuit comprises: a first diode having an anode and a cathode respectively connected to the third p-type doped region and the fourth p-type doped region; a second diode having a cathode and an anode respectively connected to the third p-type doped region and the fourth p-type doped region; a third diode and a fourth diode having anodes connected together and cathodes respectively connected to the third p-type doped region and the fourth p-type doped region; a capacitor connected between the anodes of the third and fourth diodes and the detection node; and a resistor connected between the detection node and the p-type bias region.

In addition, the bias circuit comprises: a first PMOS transistor and a second PMOS transistor, connected in series, and the serially connected first and second PMOS transistors are further connected between the first voltage supply and the third voltage supply; wherein gates of the first and second PMOS transistors respectively connected to the third voltage supply and the first voltage supply, and bulks and a connection node of the first and second PMOS transistors are connected to the p-type bias region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
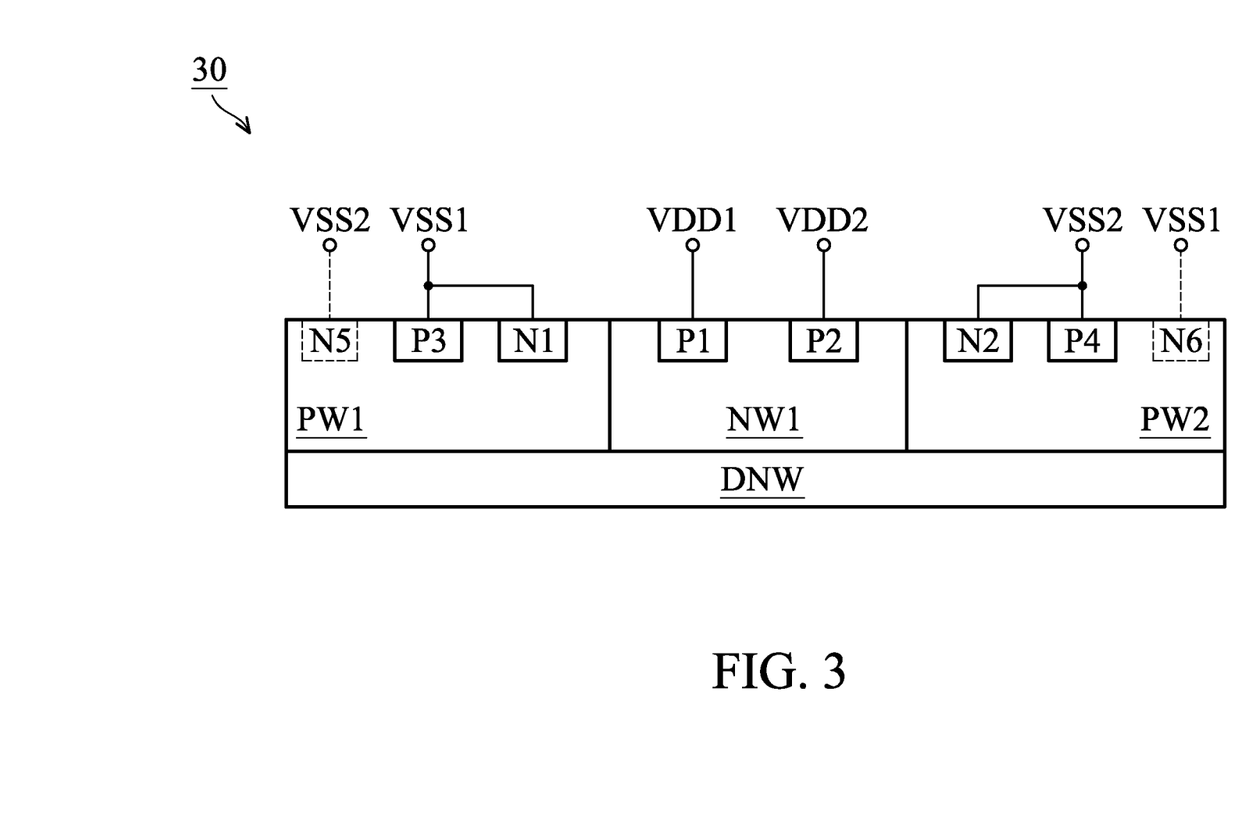
FIG. 3 shows a cross section of a cross-domain ESD (electrostatic discharge) protection cell (device) according to a first exemplary embodiment of the invention.

FIG. 3 shows a cross section of a cross-domain ESD (electrostatic discharge) protection cell (device) according to a first exemplary embodiment of the invention. The cross-domain ESD cell 30 comprises a deep n-well DNW formed in a substrate, a first p-well PW1 and a second p-well PW2 formed in the deep n-well DNW, and a first n-well NW1 formed in the deep n-well DNW and between the first p-well PW1 and the second p-well PW2, where the first n-well contacting the first p-well P1 and the second p-well P2.

Referring to FIG. 3, the cross-domain ESD protection cell 30 further comprises a first p-type doped region P1 and a second p-type doped region P2 formed in the first n-well NW1; a third P-type doped region P3 and a fourth P-type doped region P4 respectively formed in the first p-well PW1 and the second p-well PW2; a first n-type doped region N1 formed in the first p-well PW1 and between the third and first p-type doped regions P3 and P1; and a second n-type doped region N2 formed in the second p-well PW2 and between the second and fourth P-type wells P2 and P4.

The first p-type doped region P1 is connected to a first voltage supply VDD1 of a first power domain, the third p-type doped region P3 and the first n-type doped region N1 are connected to a second voltage supply (VSS1) of the first power domain. Moreover, the second p-type doped region P2 is connected to a third voltage supply VDD2 of a second power domain, the fourth p-type doped region P4 and the second n-type doped region N2 are connected to a fourth voltage supply VSS2 of the second power domain. Here, the first and second power domains are different power domains.

Figure 4:
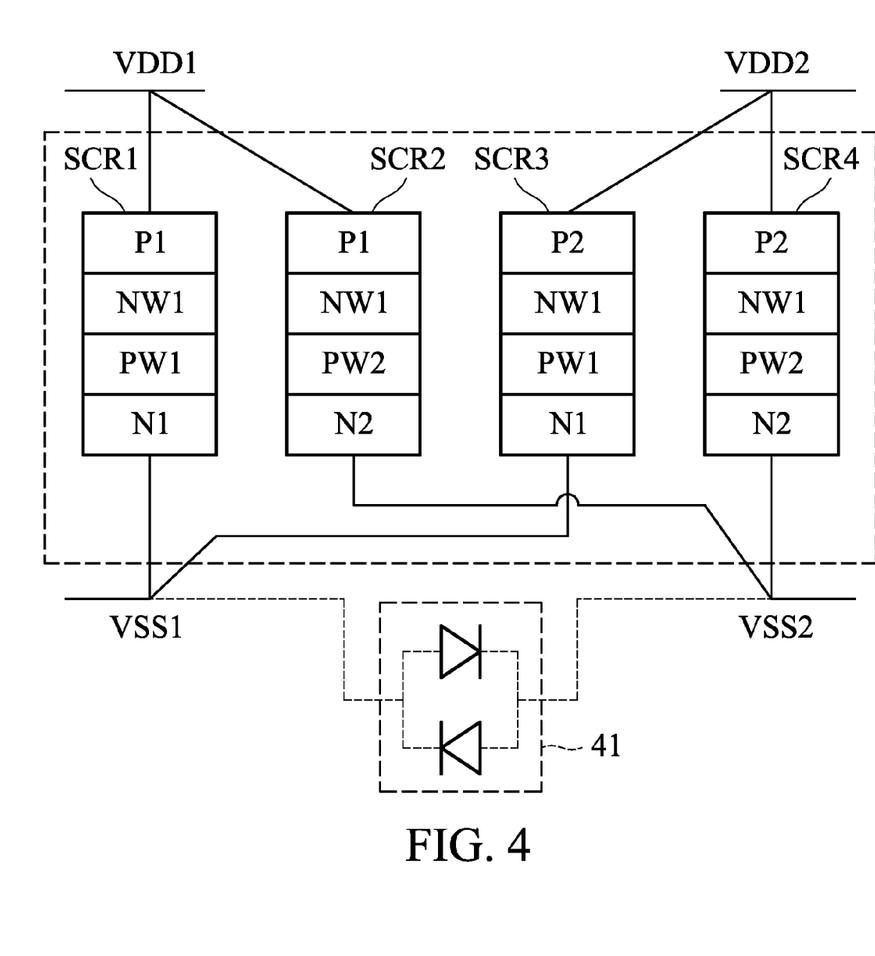
FIG. 4 shows a QSCR structure embedded in the cross-domain ESD protection cell according to the invention.

In view of the structure described in FIG. 3, the cross-domain ESD protection cell 31 comprises (or embeds) four SCR (silicon-controlled rectifier) structures (hereinafter is referred to as QSCR). The four embedded SCR structures of SCR1~SCR4 are respectively made of P1-NW1-PW1-N1 (path VDD1-to-VSS1), P1-NW1-PW2-N2 (path VDD1-to-VSS2), P2-NW1-PW1-N1 (path VDD2-to-VSS1) and P2-NW1-PW2-N2 (path VDD2-to-VSS2), and are schematically shown in FIG. 4. Accordingly, the cross-domain ESD protection cell 30 in FIG. 3 provides sufficient paths for cross-power-domain ESD protection with single cell layout, and therefore meet the requirements for small area utilization and compact layout.

The cross-domain ESD protection cell 30 of FIG. 3 may further comprise a fifth n-type doped region N5 and a sixth n-type doped region N6 respectively formed in the first p-well P1 and the second p-well P2 and respectively connected to the fourth voltage supply VSS2 and the second voltage supply VSS1, to provide diode connection 41 (FIG. 4) between the second voltage supply VSS1 and the fourth voltage supply VSS2. The fifth and sixth n-type doped regions N5 and N6 are optional arrangement for the cross-domain ESD protection cell 30.

Figure 5:
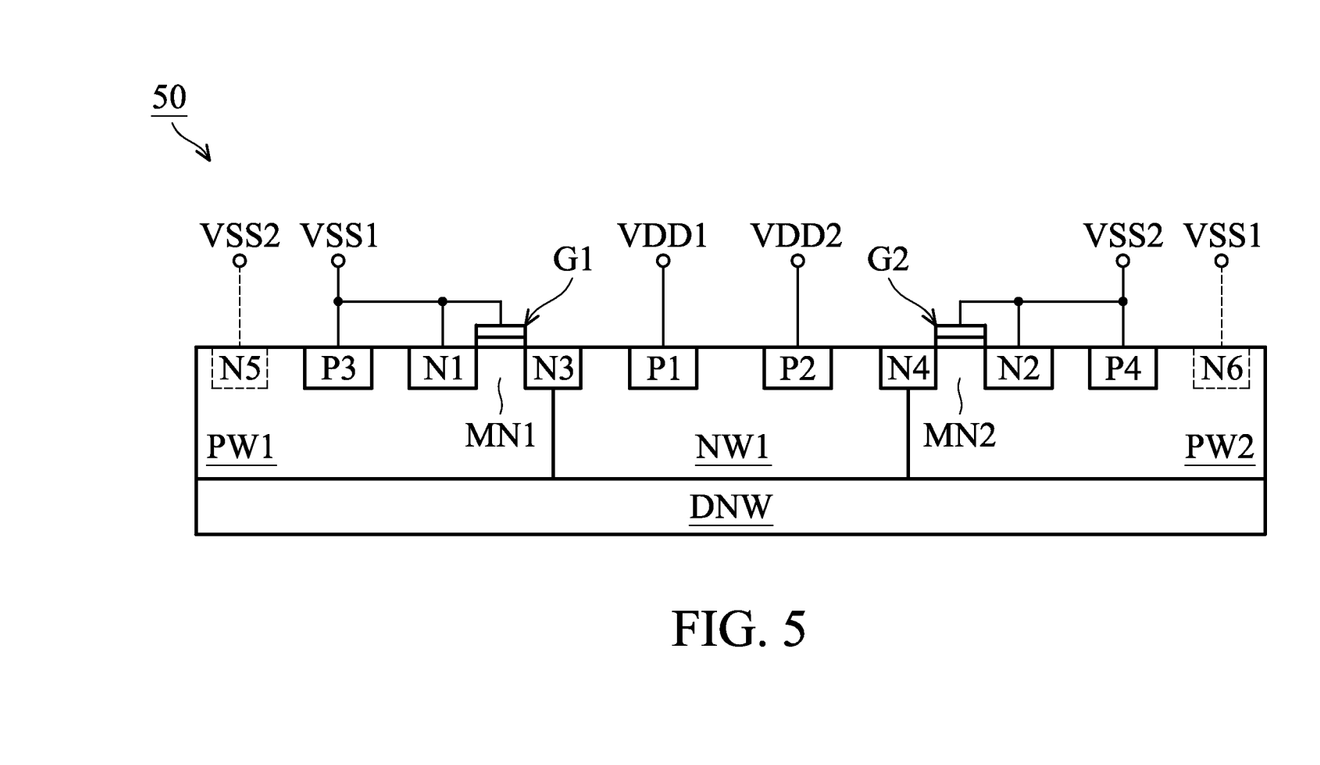
FIG. 5 shows a cross section of a cross-domain ESD protection cell (device) according to a second exemplary embodiment of the invention.

FIG. 5 shows a cross section of a cross-domain ESD protection cell (device) according to a second exemplary embodiment of the invention. Compared with FIG. 3, the cross-domain ESD protection cell 50 of FIG. 5 further comprises a third n-type doped region N3, a first gate structure G1, a fourth n-type doped region N4 and a second gate structure G2. The third n-type doped region N3 is formed in a first boundary region of the first p-well P1 and the first n-well N1, and between the first n-type doped region N1 and the first p-type doped region P1. The first gate structure G1 is formed on the first p-well P1 and between the first n-type doped region N1 and the third n-type doped region N3. The fourth n-type doped region N4 is formed in a second boundary region of the second p-well P2 and the first n-well N1, and between the second n-type doped region N2 and the second p-type doped region P2. The second gate structure G2 is formed on the second p-well P2 and between the second n-type doped region N2 and the fourth n-type doped region N4. Furthermore, the first and second gate structures G1 and G2 are respectively connected to the second voltage supply VSS1 and the fourth voltage supply VSS2. The cross-domain ESD protection cell 50 also has four embedded SCR (silicon-controlled rectifier) structures (QSCR) as described in FIG. 4.

It should be noted that the first gate structure G1, the first n-type doped region N1 and the third n-type doped region N3 constitute a first NMOS transistor MN1 and the second gate structure G2, the second n-type doped region N2 and the third n-type doped region N4 constitute a second NMOS transistor MN2. Therefore, the cross-domain ESD protection cell 50 embeds two grounded-gate NMOS (GGNMOS) transistors (MN1, MN2) to provide the trigger mechanism, and thus can further reduce the trigger voltage of the QSCR structure to a safe level. In short, to trigger or activate the cross-domain ESD protection cell for an ESD event, the trigger voltage of the ESD protection cell 50 is lower than that of the ESD protection cell 30.

The fifth and sixth n-type doped regions N5 and N6 in FIG. 5 are optional arrangement for the cross-domain ESD protection cell 50.

Figure 6A:
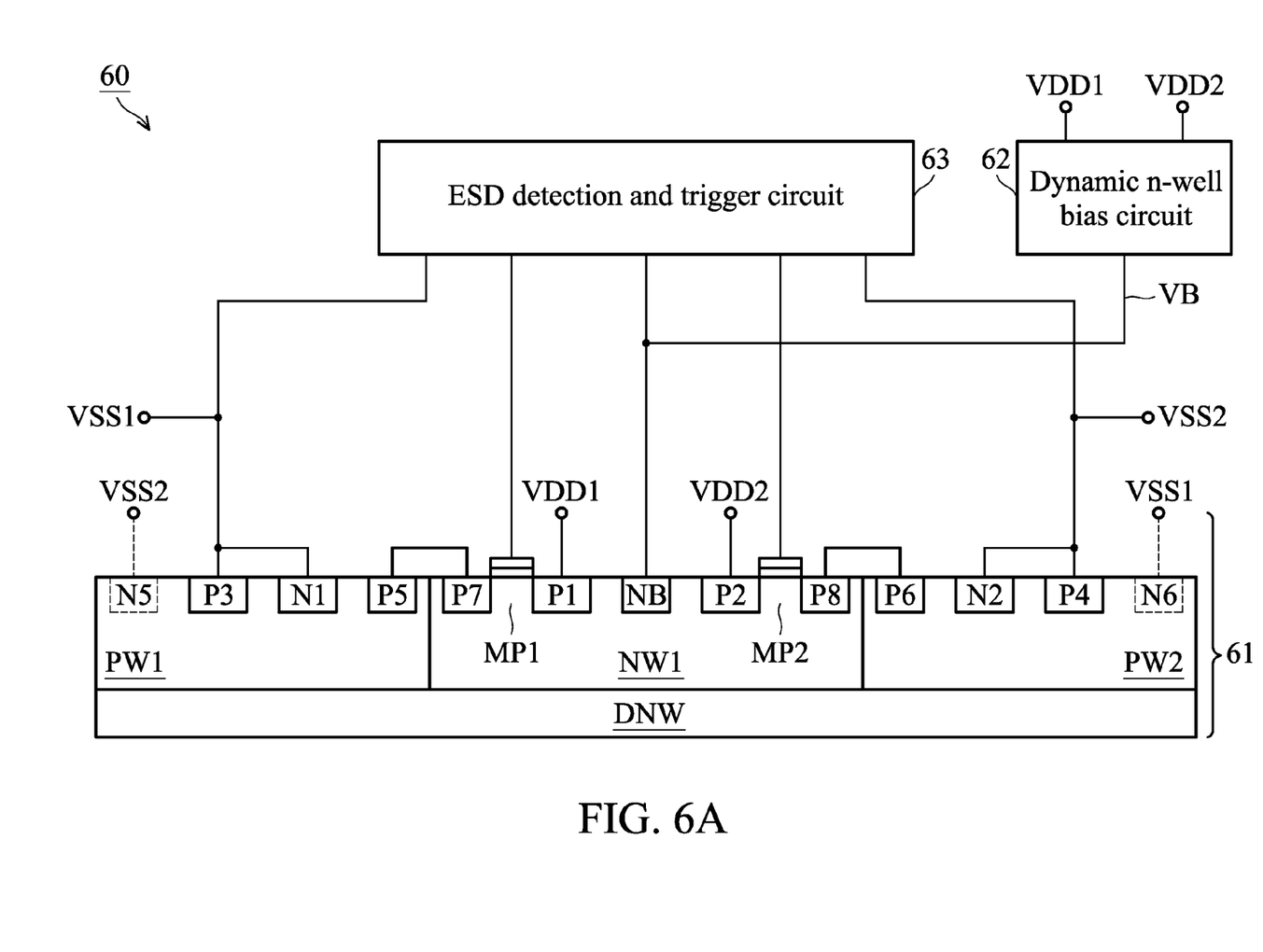
FIG. 6A shows a cross-sectional view of a cross-domain ESD protection device according to a third exemplary embodiment of the invention.

FIG. 6A shows a cross-sectional view of a cross-domain ESD protection device according to a third exemplary embodiment of the invention. The cross-domain ESD protection device 60 comprise a cross-domain ESD protection cell 61, a dynamic n-well bias circuit 62 and an ESD detection and trigger circuit 63.

Compared to FIG. 3, the cross-domain ESD protection cell 61 further comprises a p-type (doped) bias region NB, a fifth p-type doped region P5, a sixth p-type doped region P6, a seventh p-type doped region P7, an eighth p-type doped region P8, a third gate structure G3 and a fourth gate structure G4.

The p-type bias region NB is formed in the first n-well N1 and between the first p-type doped region P1 and the second p-type doped region P2. The fifth p-type doped region P5 and the seventh p-type doped region P7 are respectively formed in the first p-well P1 and the first n-well N1, and both are disposed between the first n-type doped region N1 and the first p-type doped region P1. The sixth p-type doped region P6 and the eighth p-type doped region P8 are respectively formed in the second p-well P2 and the first n-well N1, and both are disposed between the second n-type doped region N2 and the second p-type doped region P2. The third gate structure G3 is formed on the first n-well N1 and between the first and seventh p-type doped regions P1 and P7. The fourth gate structure G4 is formed on the first n-well N1 and between the second and eighth p-type doped regions P2 and P8.

The fifth and seventh p-type doped regions P5 and P7 are electrically connected, and the sixth and eighth p-type doped regions P6 and P8 are electrically connected. Furthermore, the third and fourth gate structures G3 and G4 are connected to the ESD detection and trigger circuit 63, and the p-type bias region NB is connected to a bias voltage VB provided by the dynamic n-well bias circuit 62. It should be noted that the third gate structures G3, the first and seventh n-type doped regions P1 and P7 constructs a first PMOS transistor MP1, and the fourth gate structures G4, the second and eighth n-type doped regions P2 and P8 constructs a second PMOS transistor MP2.

The ESD detection and trigger circuit 63 generates an detection voltage to the third and fourth gate structures to activates the cross-domain ESD protection cell 61 when an ESD event occurs at any of the first, second, third and fourth voltage supply VDD1, VSS1, VDD2 and VSS2.

Figure 6B:
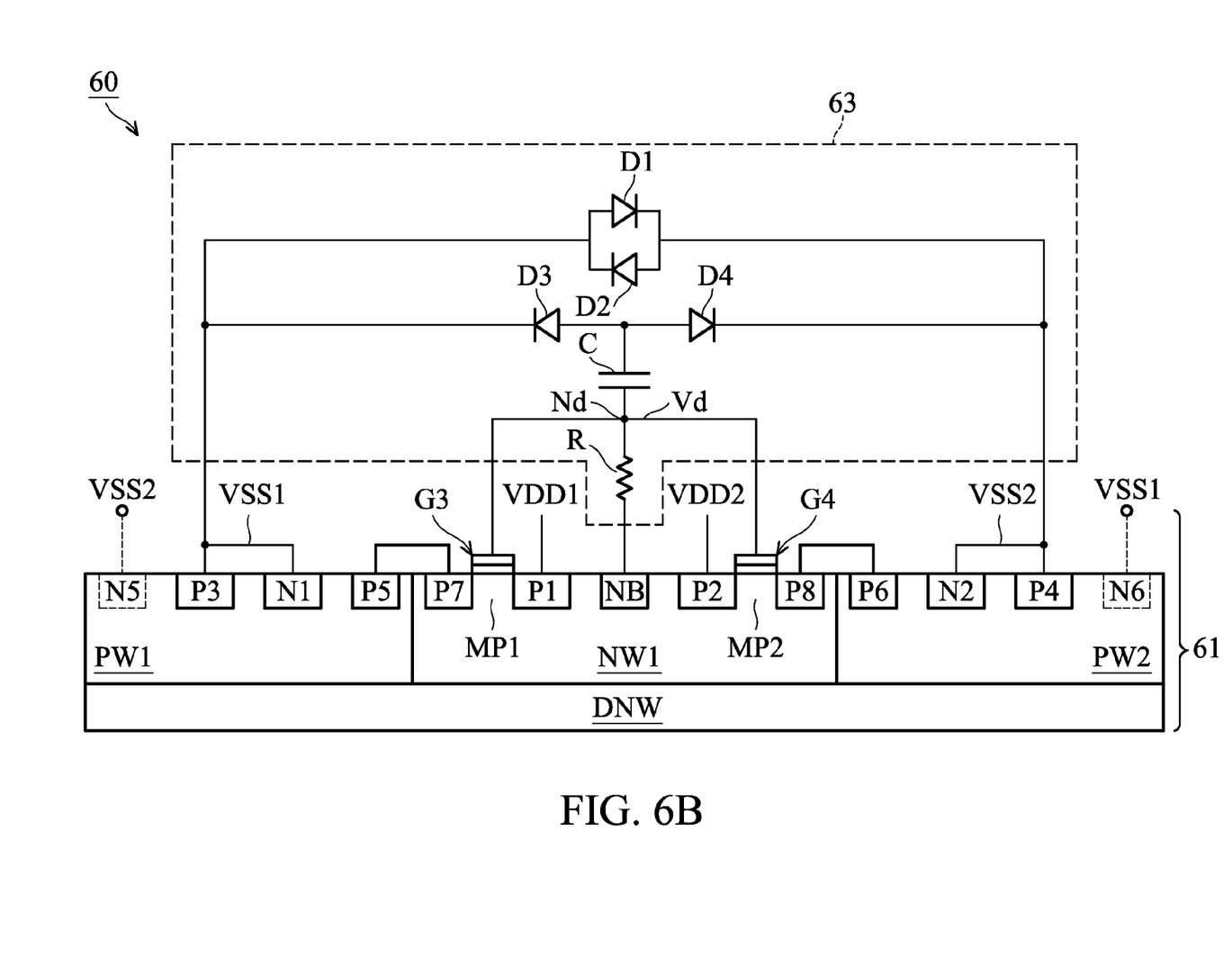
FIG. 6B shows an exemplary implement of the ESD detection and trigger circuit 63 of FIG. 6A.

FIG. 6B shows an exemplary implement of the ESD detection and trigger circuit 63 of FIG. 6A. The exemplary ESD detection and trigger circuit 63 comprises a first diode D1 having an anode and a cathode respectively connected to the third p-type doped region P3 and the fourth p-type doped region P4, a second diode D2 having a cathode and an anode respectively connected to the third p-type doped region P3 and the fourth p-type doped region P4, a third diode D3 and a fourth diode D4 having anodes connected together and cathodes respectively connected to the third p-type doped region P3 and the fourth p-type doped region P4, a capacitor C connected between the anodes of the third and fourth diodes D3, D4 and a detection node Nd, and a resistor R connected between the detection node Nd and the p-type bias region NB.

The cross-domain ESD protection cell 61 has four embedded SCR structures SCR1~SCR4, which are respectively made of P1-NW1-PW1-N1 (path VDD1-to-VSS1), P1-NW1-PW2-N2 (path VDD1-to-VSS2), P2-NW1-PW1-N1 (path VDD2-to-VSS1) and P2-NW1-PW2-N2 (path VDD2-to-VSS2). Therefore, the cross-domain ESD protection cell 61 comprises the QSCR structure as that schematically shown in FIG. 4. When an ESD event occurs at any of the first, second, third and fourth voltage supply VDD1, VSS1, VDD2 and VSS2, the gate structures G3 and G4 receive the detection voltage Vd in response to the ESD event, thereby generating trigger voltage to the fifth and/or sixth p-type doped regions P5, P6 to trigger or activate the corresponding SCR1~SCR4 for ESD protection. The ESD detection and trigger circuit 63 of FIG. 6B serves as an external trigger circuit to reduce trigger voltage of the QSCR (SCR1~SCR4) structure of the cross-domain ESD protection cell 61. For certain applications, the trigger voltage provided by the GGNMOS transistors (such as the ESD protection cell 50 described in FIG. 5) is not adequate, and thus the external trigger circuit as described in FIG. 6B can be applied to further reducing trigger voltage of SCR structures.

Figure 6C:
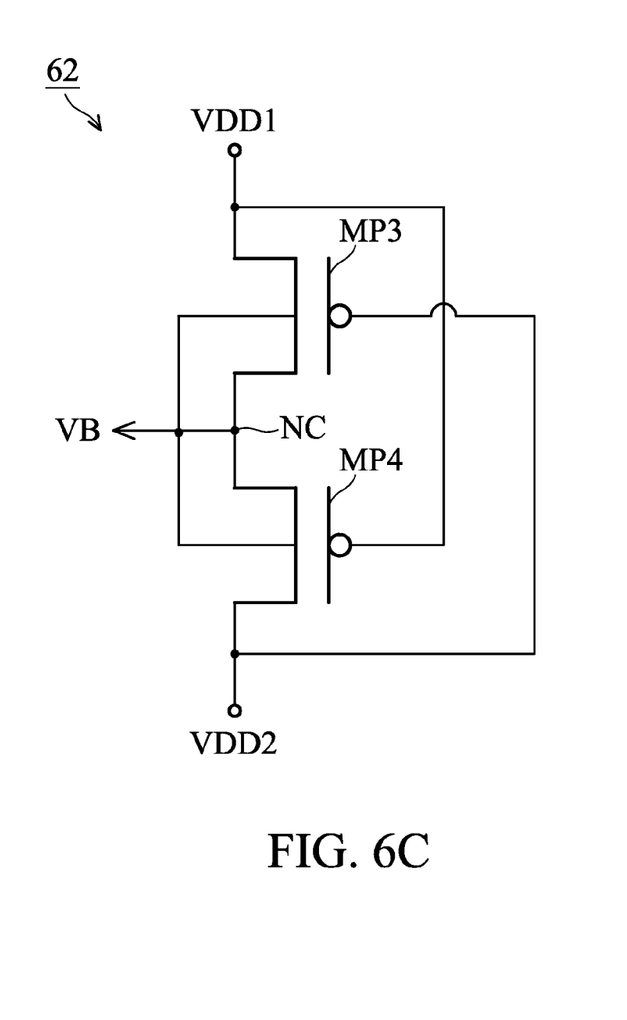
FIG. 6C shows an exemplary implement of the dynamic n-well bias circuit 62 of FIG. 6A.

The dynamic n-well bias circuit 62 provides the bias voltage VB to the p-type bias region NB based on the first voltage supply VDD1 and the third voltage supply VDD2, to reduce leakage current of the cross-domain ESD protection cell 61 when no ESD event occurs (i.e., when the integrated circuit under ESD protection normally operates). FIG. 6C shows an exemplary implement of the dynamic n-well bias circuit 62 of FIG. 6A. In FIG. 6C, the dynamic n-well bias circuit 62 comprises a third PMOS transistor MP3 and a fourth PMOS transistor MP4, connected in series. The serially connected third and fourth PMOS transistors MP3, MP4 are further connected between the first voltage supply VDD 1 and the third voltage supply VDD2. Gates of the third and fourth PMOS transistors MP3, MP4 are respectively connected to the third voltage supply VDD2 and the first voltage supply VDD1, and bulks and a connection node NC of the third and fourth PMOS transistors MP3, MP4 are connected to the p-type bias region NB. That is, the bias voltage VB corresponding to the maximum of VDD1 and VDD2, is output at the connection node NC.

The fifth and sixth n-type doped regions N5 and N6 in FIGS. 6A and 6B are an optional arrangement for the cross-domain ESD protection cell 61.

Figure 7A:
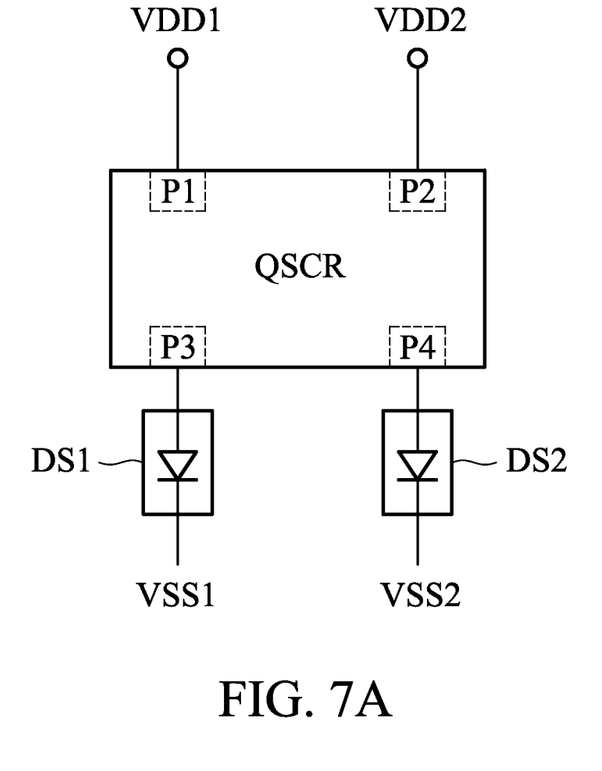
FIG. 7A shows arrangement of diode strings to the cross-domain ESD protection cell having QSCR structure according to the invention.
Figure 7B:
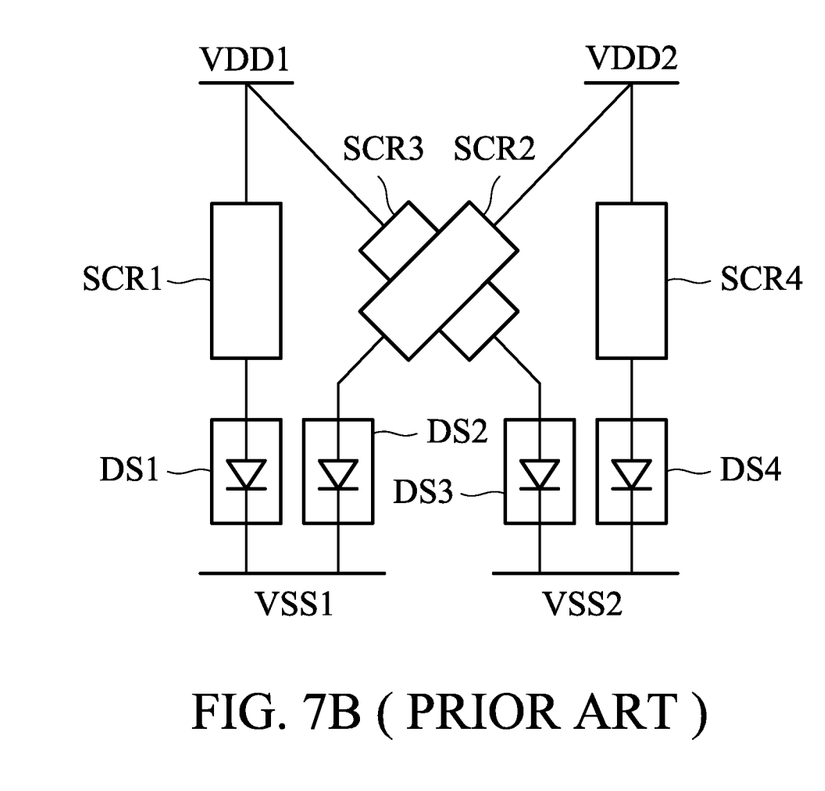
FIG. 7B shows arrangement of diode strings to the conventional cross-domain ESD protection cell without QSCR structure.

To increase holding voltage of the QSCR structures in FIGS. 3, 5, 6A and 6B, two diode strings may be arranged between the third p-type doped regions (P3) and the second voltage supply VSS1, and between the fourth p-type doped regions (P4) and the fourth voltage supply VSS2. Such an arrangement to increase holding voltage is schematically shown in FIG. 7A, where each of the diode strings DS1 and DS2 may comprise one or more diodes (connected in series, in parallel or in both ways). Without the QSCR structure, the conventional way to increase holding voltage requires four diode strings D1~D4 respectively connected to the corresponding SCRs SCR1~SCR4, as shown in FIG. 7B. Based on the QSCR structure of the invention, only two diode strings are required, and thus the silicon footprint and leakage current are reduced.

In view of the above descriptions, the QSCR structure of the invention can provide robust ESD protection for cross-power-domain application with low area consumption.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cross-domain electrostatic discharge protection device, comprising: a deep n-well formed in a substrate; a first p-well and a second p-well formed in the deep n-well; a first n-well formed in the deep n-well and between the first p-well and the second p-well, the first n-well contacting the first p-well and the second p-well; a first p-type doped region and a second p-type doped region formed in the first n-well; a third P-type doped region and a fourth P-type doped region respectively formed in the first p-well and the second p-well; a first n-type doped region formed in the first p-well and between the third and first p-type doped regions; and a second n-type doped region formed in the second p-well and between the second and fourth P-type region; wherein the first p-type doped region is connected to a first voltage supply of a first power domain, the third p-type doped region and the first n-type doped region are connected to a second voltage supply of the first power domain; wherein the second p-type doped region is connected to a third voltage supply of a second power domain, the fourth p-type doped region and the second n-type doped region are connected to a fourth voltage supply of the second power domain; and wherein the first and second power domains are different domains.

2. The cross-domain ESD protection device as claimed in claim 1, further comprising:
   a third n-type doped region formed in a first boundary region of the first p-well and the first n-well, and between the first n-type doped region and the first p-type doped region;
   a first gate structure formed on the first p-well and between the first n-type doped region and the third n-type doped region;
   a fourth n-type doped region formed in a second boundary region of the second p-well and the first n-well, and between the second n-type doped region and the second p-type doped region; and
   a second gate structure formed on the second p-well and between the second n-type doped region and the fourth n-type doped region;
   wherein the first and second gate structures are respectively connected to the second voltage supply and the fourth voltage supply.

3. The cross-domain ESD protection device as claimed in claim 1, further comprising:
   a p-type bias region formed in the first n-well and between the first p-type doped region and the second p-type doped region;
   a fifth p-type doped region and a seventh p-type doped region respectively formed in the first p-well and the first n-well, and disposed between the first n-type doped region and the first p-type doped region;
   a sixth p-type doped region and an eighth p-type doped region respectively formed in the second p-well and the first n-well, and disposed between the second n-type doped region and the second p-type doped region;
   a third gate structure formed on the first n-well and between the first and seventh p-type doped regions;
   a fourth gate structure formed on the first n-well and between the second and eighth p-type doped regions;
   wherein the fifth and seventh p-type doped regions are electrically connected and the sixth and eighth p-type doped regions are electrically connected, the third and fourth gate structures are connected to a detection node and the p-type bias region is connected to a bias voltage.

4. The cross-domain ESD protection device as claimed in claim 3, further comprising a bias circuit providing the bias voltage based on the first voltage supply and the third voltage supply, to reduce leakage current of the cross-domain ESD protection device.

5. The cross-domain ESD protection device as claimed in claim 4, wherein the bias circuit comprises a first PMOS transistor and a second PMOS transistor, connected in series, and the serially connected first and second PMOS transistors are further connected between the first voltage supply and the third voltage supply;
wherein gates of the first and second PMOS transistors respectively connected to the third voltage supply and the first voltage supply, and bulks and a connection node of the first and second PMOS transistors are connected to the p-type bias region.

6. The cross-domain ESD protection device as claimed in claim 3, further comprising an ESD detection and trigger circuit, connected to the first, second, third and fourth p-type doped region, the p-type bias region, and the third and fourth gate structures;
wherein the ESD detection and trigger circuit generates a detection voltage to the third and fourth gate structures to activate the cross-domain ESD protection device when an ESD event occurs at any of the first, second, third and fourth voltage supply.

7. The cross-domain ESD protection device as claimed in claim 6, wherein the ESD detection and trigger circuit comprises:
a first diode having an anode and a cathode respectively connected to the third p-type doped region and the fourth p-type doped region;
a second diode having a cathode and an anode respectively connected to the third p-type doped region and the fourth p-type doped region;
a third diode and a fourth diode having anodes connected together and cathodes respectively connected to the third p-type doped region and the fourth p-type doped region;
a capacitor connected between the anodes of the third and fourth diodes and the detection node; and
a resistor connected between the detection node and the p-type bias region.

8. The cross-domain ESD protection device as claimed in claim 4, further comprising an ESD detection and trigger circuit, connected to the first, second, third and fourth p-type doped region, the p-type bias region, and the third and fourth gate structures;
wherein the ESD detection and trigger circuit generates a detection voltage to the third and fourth gate structures to activate the cross-domain ESD protection device when an ESD event occurs at any of the first, second, third and fourth voltage supply.

9. The cross-domain ESD protection device as claimed in claim 8, wherein the ESD detection and trigger circuit comprises:
a first diode having an anode and a cathode respectively connected to the third p-type doped region and the fourth p-type doped region;
a second diode having a cathode and an anode respectively connected to the third p-type doped region and the fourth p-type doped region;
a third diode and a fourth diode having anodes connected together and cathodes respectively connected to the third p-type doped region and the fourth p-type doped region;
a capacitor connected between the anodes of the third and fourth diodes and the detection node; and
a resistor connected between the detection node and the p-type bias region.

10. The cross-domain ESD protection device as claimed in claim 1, further comprising a fifth n-type doped region and a sixth n-type doped region respectively formed in the first p-well and the second p-well and respectively connected to the fourth voltage supply and the second voltage supply.

11. The cross-domain ESD protection device as claimed in claim 2, further comprising a fifth n-type doped region and a sixth n-type doped region respectively formed in the first p-well and the second p-well and respectively connected to the fourth voltage supply and the second voltage supply.

12. The cross-domain ESD protection device as claimed in claim 3, further comprising a fifth n-type doped region and a sixth n-type doped region respectively formed in the first p-well and the second p-well and respectively connected to the fourth voltage supply and the second voltage supply.

13. A cross-domain electrostatic discharge protection device, comprising: a deep n-well formed in a substrate; a first p-well and a second p-well formed in the deep n-well; a first n-well formed in the deep n-well and between the first p-well and the second p-well, the first n-well contacting the first p-well and the second p-well; a first p-type doped region and a second p-type doped region formed in the first n-well; a third P-type doped region and a fourth P-type doped region respectively formed in the first p-well and the second p-well; a first n-type doped region formed in the first p-well and between the third and first p-type doped regions; and a second n-type doped region formed in the second p-well and between the second and fourth P-type region; a p-type bias region formed in the first n-well and between the first p-type doped region and the second p-type doped region; a fifth p-type doped region and a seventh p-type doped region respectively formed in the first p-well and the first n-well, and disposed between the first n-type doped region and the first p-type doped region; a sixth p-type doped region and an eighth p-type doped region respectively formed in the second p-well and the first n-well, and disposed between the second n-type doped region and the second p-type doped region; a third gate structure formed on the first n-well and between the first and seventh p-type doped regions; a fourth gate structure formed on the first n-well and between the second and eighth p-type doped regions; and an ESD detection and trigger circuit connected to the first, second, third and fourth p-type doped region, the p-type bias region, and the third and fourth gate structures; wherein the first p-type doped region is connected to a first voltage supply of a first power domain, the third p-type doped region and the first n-type doped region are connected to a second voltage supply of the first power domain; wherein the second p-type doped region is connected to a third voltage supply of a second power domain, the fourth p-type doped region and the second n-type doped region are connected to a fourth voltage supply of the second power domain; and wherein the first and second power domains are different domains; wherein the fifth and seventh p-type doped regions are electrically connected and the sixth and eighth p-type doped regions are electrically connected, the third and fourth gate structures are connected to a detection node and the p-type bias region is connected to a bias voltage; wherein the ESD detection and trigger circuit generates a detection voltage to the third and fourth gate structures to activate the cross-domain ESD protection device when an ESD event occurs at any of the first, second, third and fourth voltage supply.

14. The cross-domain ESD protection device as claimed in claim 13, wherein the ESD detection and trigger circuit comprises:
- a first diode having an anode and a cathode respectively connected to the third p-type doped region and the fourth p-type doped region;
- a second diode having a cathode and an anode respectively connected to the third p-type doped region and the fourth p-type doped region;
- a third diode and a fourth diode having anodes connected together and cathodes respectively connected to the third p-type doped region and the fourth p-type doped region;
- a capacitor connected between the anodes of the third and fourth diodes and the detection node; and
- a resistor connected between the detection node and the p-type bias region.

15. The cross-domain ESD protection device as claimed in claim 14, further comprising a bias circuit providing the bias voltage based on the first voltage supply and the third voltage supply, to reduce leakage current of the cross-domain ESD protection device.

16. The cross-domain ESD protection device as claimed in claim 15, wherein the bias circuit comprises a first PMOS transistor and a second PMOS transistor, connected in series, and the serially connected first and second PMOS transistors are further connected between the first voltage supply and the third voltage supply;
wherein gates of the first and second PMOS transistors respectively connected to the third voltage supply and the first voltage supply, and bulks and a connection node of the first and second PMOS transistors are connected to the p-type bias region.

* * * * *